United States Patent
Shirali et al.

(10) Patent No.: US 8,539,304 B1
(45) Date of Patent: Sep. 17, 2013

(54) PARALLEL ENCODER FOR LOW-DENSITY PARITY-CHECK (LDPC) CODES

(75) Inventors: Kedar Shirali, San Jose, CA (US); Rohit U. Nabar, Santa Clara, CA (US); Vikas Gulati, Mountain View, CA (US); Sudhir Srinivasa, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 229 days.

(21) Appl. No.: 13/090,642

(22) Filed: Apr. 20, 2011

Related U.S. Application Data

(60) Provisional application No. 61/328,562, filed on Apr. 27, 2010.

(51) Int. Cl.
  *H03M 13/00* (2006.01)
(52) U.S. Cl.
  USPC .......................................................... 714/758
(58) Field of Classification Search
  None
  See application file for complete search history.

(56) References Cited

U.S. PATENT DOCUMENTS

| | | | | |
|---|---|---|---|---|
| 7,499,490 | B2* | 3/2009 | Divsalar et al. | 375/240 |
| 8,095,859 | B1* | 1/2012 | Peterson et al. | 714/801 |
| 8,234,555 | B2* | 7/2012 | Yokokawa | 714/786 |
| 8,327,215 | B2* | 12/2012 | Yoon et al. | 714/752 |
| 2004/0034828 | A1* | 2/2004 | Hocevar | 714/800 |
| 2006/0291571 | A1* | 12/2006 | Divsalar et al. | 375/242 |
| 2010/0251062 | A1* | 9/2010 | Chen et al. | 714/752 |

* cited by examiner

*Primary Examiner* — Guerrier Merant

(57) ABSTRACT

A low-density parity check (LDPC) encoder that calculate parity check values for a message using an LDPC parity check matrix is provided. A matrix-vector multiplication unit is operative to multiply a portion of the LDPC parity check matrix and the message to obtain an intermediate vector. A parallel recursion unit is operative to recursively calculate a first plurality of parity check values for the message based on the intermediate vector and to recursively calculate a second plurality of parity check values for the message based on the intermediate vector. The first plurality of parity check values are calculated in parallel with the second plurality of parity check values.

20 Claims, 8 Drawing Sheets

$$H = \begin{bmatrix} 13 & 48 & 80 & 66 & 4 & 74 & 7 & 30 & 76 & 52 & 37 & 80 & -1 & 49 & 73 & 31 & 74 & 73 & 23 & -1 & 1 & 0 & -1 & -1 \\ 69 & 63 & 74 & 56 & 64 & 77 & 57 & 65 & 6 & 16 & 51 & -1 & 64 & -1 & 68 & 9 & 48 & 62 & 54 & 27 & -1 & 0 & 0 & -1 \\ 51 & 15 & 0 & 80 & 24 & 25 & 42 & 54 & 44 & 71 & 71 & 9 & 87 & 4 & -1 & -1 & -1 & 29 & -1 & 53 & 0 & -1 & 0 & 0 \\ 16 & 29 & 36 & 41 & 44 & 56 & 59 & 37 & 50 & 24 & -1 & 65 & 52 & -1 & -1 & 58 & -1 & 4 & -1 & 52 & 1 & -1 & -1 & 0 \end{bmatrix} \leftarrow 301$$

$$P_0 = \begin{bmatrix} 1 & 0 & 0 & 0 & 0 & 0 & 0 & 0 & 0 \\ 0 & 1 & 0 & 0 & 0 & 0 & 0 & 0 & 0 \\ 0 & 0 & 1 & 0 & 0 & 0 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 1 & 0 & 0 & 0 \\ 0 & 0 & 0 & 0 & 0 & 0 & 1 & 0 & 0 \\ 0 & 0 & 0 & 0 & 0 & 0 & 0 & 1 & 0 \\ 0 & 0 & 0 & 0 & 0 & 0 & 0 & 0 & 1 \end{bmatrix} \leftarrow 302a$$

$$P_2 = \begin{bmatrix} 0 & 0 & 1 & 0 & 0 & 0 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \\ 0 & 0 & 0 & 0 & 0 & 1 & 0 & 0 & 0 \\ 0 & 0 & 0 & 0 & 0 & 0 & 1 & 0 & 0 \\ 0 & 0 & 0 & 0 & 0 & 0 & 0 & 1 & 0 \\ 0 & 0 & 0 & 0 & 0 & 0 & 0 & 0 & 1 \\ 1 & 0 & 0 & 0 & 0 & 0 & 0 & 0 & 0 \\ 0 & 1 & 0 & 0 & 0 & 0 & 0 & 0 & 0 \end{bmatrix} \leftarrow 302b$$

$$P_5 = \begin{bmatrix} 0 & 0 & 0 & 0 & 0 & 1 & 0 & 0 & 0 \\ 0 & 0 & 0 & 0 & 0 & 0 & 1 & 0 & 0 \\ 0 & 0 & 0 & 0 & 0 & 0 & 0 & 1 & 0 \\ 0 & 0 & 0 & 0 & 0 & 0 & 0 & 0 & 1 \\ 1 & 0 & 0 & 0 & 0 & 0 & 0 & 0 & 0 \\ 0 & 1 & 0 & 0 & 0 & 0 & 0 & 0 & 0 \\ 0 & 0 & 1 & 0 & 0 & 0 & 0 & 0 & 0 \\ 0 & 0 & 0 & 1 & 0 & 0 & 0 & 0 & 0 \\ 0 & 0 & 0 & 0 & 1 & 0 & 0 & 0 & 0 \end{bmatrix} \leftarrow 302c$$

PARALLEL ENCODER FOR LOW-DENSITY PARITY-CHECK (LDPC) CODES

CROSS-REFERENCE TO RELATED APPLICATIONS

This claims the benefit under 35 U.S.C. §119(e) of U.S. Provisional Application No. 61/328,562, filed Apr. 27, 2010.

This application is also related to U.S. application Ser. No. 12/187,858, filed Aug. 7, 2008.

Both of these prior applications are hereby incorporated by reference herein in their entirety.

BACKGROUND OF THE DISCLOSURE

The disclosed technology relates generally to data encoding, and more particularly to low-density parity check (LDPC) encoders.

With the continuing demand for high-reliability transmission of information in digital communication and storage systems, and with the rapid increase in available computational power, various coding and decoding techniques have been investigated and applied to increase the performance of these systems. One such coding technique, low-density parity check (LDPC) coding, was first proposed in the 1960s, but was not used until the late 1990s when researchers began to investigate iterative coding and decoding techniques.

LDPC codes are systematic block codes which have a very sparse parity check matrix. A sparse parity check matrix contains mostly '0' entries with only relatively few '1' entries. In a sparse parity check matrix only a very small number of message bits participate in any given parity check. LDPC codes can be regular or irregular. When the number of message bits in each parity check is the same, the LDPC codes are said to be regular. Otherwise they are said to be irregular.

The IEEE Std 802.11n™-2009 of wireless local area network (WLAN) standards allow for the use of LDPC codes as an optional mode. The IEEE Std 802.11n™-2009 standards are incorporated herein in their entirety. The LDPC codes proposed for the IEEE 802.11n standards are irregular LDPC codes. There are three LDPC block lengths in the IEEE 802.11n standards: 648, 1296, and 1944 bits. The number of parity check bits for these LDPC codes depends on the coding rate.

There are a few concerns with LDPC codes. The error floor of LDPC codes may be of particular concern; in several applications, low error floors are required. However, it may be difficult to implement a low error floor LDPC code without making the code block length large. Lengthy LDPC codes, on the other hand, may require large memory buffers and/or computational power, even though the parity-check matrix is sparse. Due to the potentially large memory and computational requirements of suitably powerful LDPC encoders, the latency of these LDPC encoders is typically greater than desired.

SUMMARY

An embodiment of a low-density parity check (LDPC) encoder calculates parity check values for a message using an LDPC parity check matrix. A matrix-vector multiplication unit is operative to multiply a portion of the LDPC parity check matrix and the message to obtain an intermediate vector. A parallel recursion unit is operative to recursively calculate a first plurality of parity check values for the message based on the intermediate vector and to recursively calculate a second plurality of parity check values for the message based on the intermediate vector. The first plurality of parity check values are calculated in parallel with the second plurality of parity check values.

An embodiment of a method and apparatus for calculating parity check values for a message uses a low-density parity check (LDPC) code. A product of a portion of an LDPC parity check matrix and the message are calculated, in an LDPC encoder, to obtain an intermediate vector. A first plurality of parity check values for the message are recursively calculated based on the intermediate vector. A second plurality of parity check values for the message are recursively calculated based on the intermediate vector. The first plurality of parity check values are calculated in parallel with the second plurality of parity check values.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which:

FIG. 3 is an illustrative parity check matrix and illustrative 8×8 circulant matrices;

DETAILED DESCRIPTION OF THE DISCLOSURE

Figure 1:
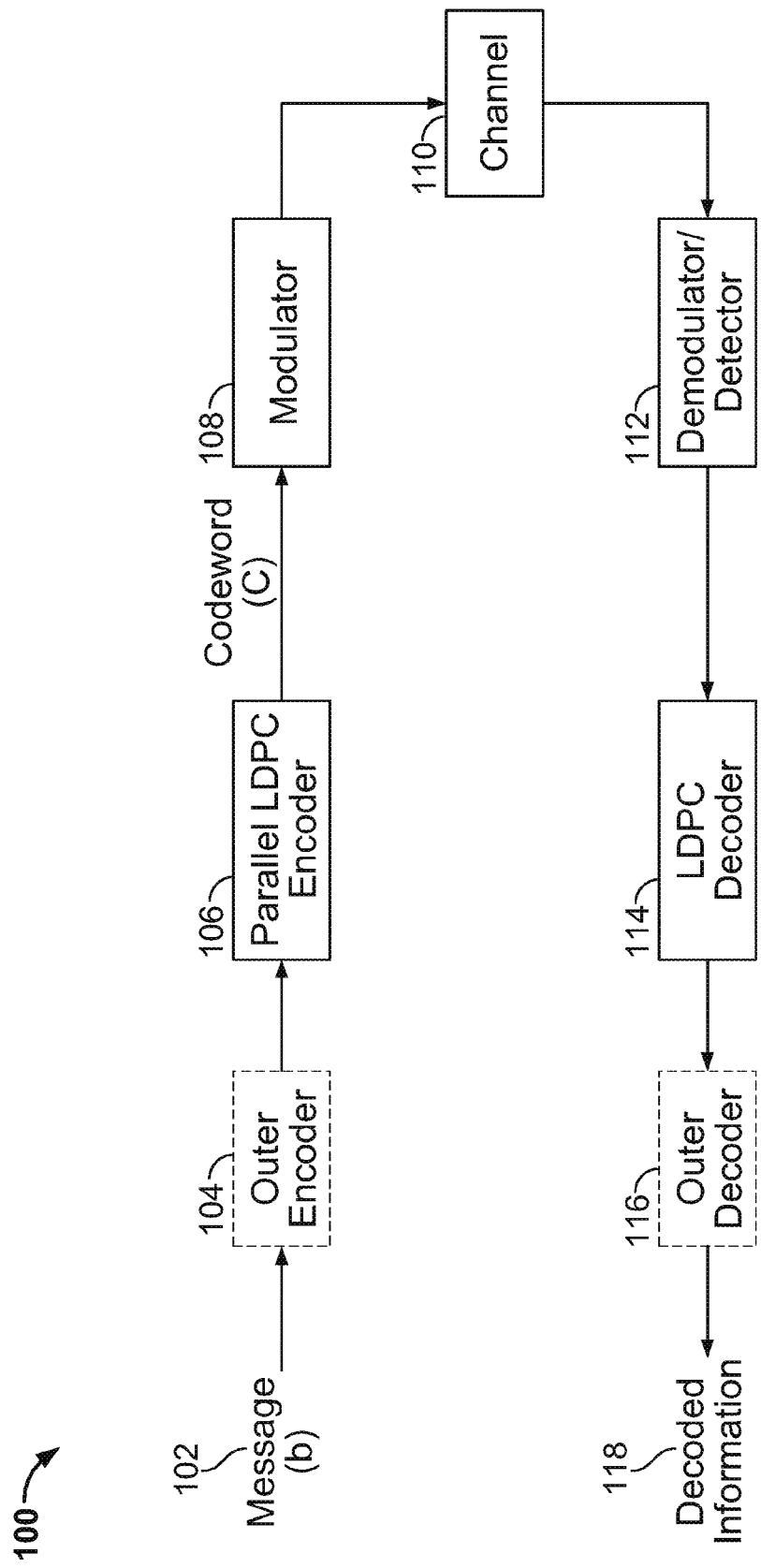
FIG. 1 is a simplified block diagram of a parallel LDPC error-correcting communications or storage system.

FIG. 1 is a simplified and illustrative block diagram of digital communications or storage system 100 that can employ the disclosed technology. System 100 may include parallel LDPC encoder 106, modulator 108, demodulator 112, LDPC decoder 114, and optionally outer encoder 104 and outer decoder 116. In some embodiments, system 100 may be any suitable communications system that is used to transmit message 102 from a source to a destination. In other embodiments, system 100 may be a suitable storage system which is used to store and read back a message from a storage medium. Message 102, sometimes referred to by the variable b, may be any form of information or useful data that a user desires to transmit or store, and can be in any suitable digital form (e.g., coded data, uncoded data, etc.).

Message 102 may be transmitted or stored using one or more information-bearing signals. The signals may be transmitted or stored in any suitable transmission or storage medium or media, represented in FIG. 1 by channel 110. For example, channel 110 may be a wired or wireless medium through which the information-bearing signal travels, or an optical (e.g., a CD-ROM), magnetic (e.g., a hard disk), or electrical (e.g., FLASH memory or RAM) storage medium that stores the information-bearing signal. Due to random noise that may occur during transmission and storage, as well as the limited transmission or storage capabilities of channel 110, the information-bearing signal may be corrupted or degraded while being transmitted or stored. Thus, the signal received from channel 110 (e.g., by demodulator 112) may be substantially different than the signal that was originally transmitted or stored (e.g., from modulator 108). To reliably transmit or store information in channel 110, an effective transmitter for preparing and transmitting message 102 may be needed, as well as a corresponding effective receiver for accurately interpreting message 102 from a received signal.

In FIG. 1, the transmitter in communications or storage system 100 is embodied by outer encoder 104 (if present), parallel LDPC encoder 106, and modulator 108. The receiver (described below) is embodied by demodulator 112, LDPC decoder 114, and outer decoder 116 (if present). Outer encoder 104 and parallel LDPC encoder 106 may encode message 102 into one or more codewords, sometimes referred to by the variable, c. In particular, outer encoder 104 may first encode message 102 using a suitable code, which may be a systematic code. For example, outer encoder 104 may encode message 102 using a Bose-Chaudhuri-Hocquenghem (BCH) or Reed-Solomon (RS) code of any suitable correction power. Parallel LDPC encoder 106 may then encode the resulting codeword into codeword c. Parallel LDPC encoder 106 may operate concurrently or subsequent to outer encoder 104 using a suitable low-density parity check (LDPC) code that is selected from among a plurality of available LDPC codes.

Once parallel LDPC encoder 106 produces the codeword, modulator 108 may convert the codeword into an information-bearing signal for transmission or storage in channel 110. Modulator 108 may operate using a modulation scheme with a signal constellation set of any suitable size and dimension. For example, modulator 108 may use a quadrature amplitude modulation (QAM) scheme (e.g., 4QAM, 16QAM, 32QAM, etc.), a pulse amplitude modulation (PAM) scheme (e.g., 2PAM, 4PAM, 8PAM, etc.), a phase shift keying (PSK) scheme (e.g., QPSK, 8PSK, etc.), and/or a orthogonal frequency division multiplexing (OFDM) scheme. The type of modulation scheme used by modulator 108 may be selected and implemented based on the properties of channel 110.

Demodulator 112 may receive an altered version of the information-bearing signal transmitted or stored by modulator 108. Demodulator 112 may then convert the information-bearing signal back into a digital sequence using the same modulation scheme as that of modulator 108. Demodulator 112 therefore produces a hard-bit or soft-bit estimate of the codeword, that is decoded by LDPC decoder 114 and outer decoder 116. LDPC decoder 114 and outer decoder 116 may decode the estimated codeword using the same LDPC and outer code, respectively, as those used by parallel LDPC encoder 106 and outer encoder 108 to produce decoded information 118. Thus, if the hard-bit or soft-bit estimate is within the correcting capability of the LDPC and outer codes employed by decoders 114 and 116, decoded information 118 may be the same as message 102.

As described above, communications or storage system 100 may or may not include outer encoder 104 and outer decoder 116. For purposes of clarity, and not by way of limitation, the various embodiments disclosed herein will often be described as if no outer code is used. For example, various embodiments may be described in which an LDPC encoder directly encodes user information (e.g., parallel LDPC encoder 106 directly encoders message 102). However, it should be understood that any of the disclosed embodiments of an LDPC encoder may instead encode the output of an outer encoder.

Figure 2:
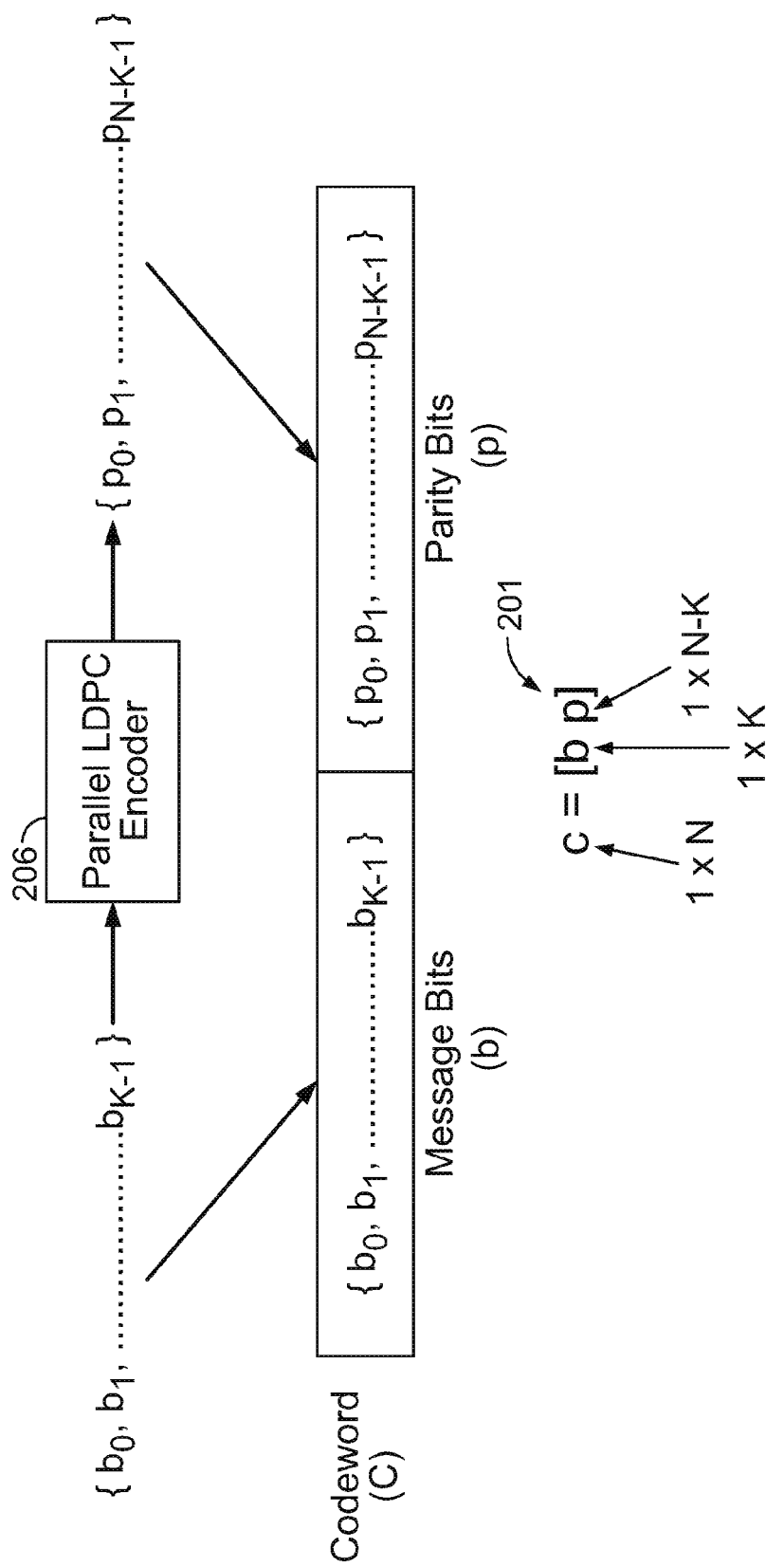
FIG. 2 is a simplified block diagram that illustrates the generation of a codeword using a parallel LDPC encoder.

FIG. 2 illustrates the generation of a codeword, c, from message, b, using parallel LDPC encoder 206. LDPC codes are systematic code. An N, K LDPC code is a code in which K message bits are encoded by appending N-K parity check bits to create a codeword having N bits. As illustrated in FIG. 2, K message bits, $b_0 \ldots b_{K-1}$, are provided to parallel LDPC encoder 206, which calculates parity check bits, $p_0 \ldots p_{N-K-1}$. N codeword bits, c, are generated by combining the K message bits, b, and the N-K parity check bits, p, as shown by equation 201. The code rate of an LDPC code represents the ratio of the number of message bits, b, to the number of codeword bits, c. For example, an LDPC code with a code rate of 5/6 will produce 1944 codeword bits (N=1944) from 1620 message bits (K=1620).

FIG. 3 shows an illustrative parity check matrix 301 that that may be employed by parallel LDPC encoder 106 (FIG. 1) and LDPC decoder 114 (FIG. 1) of system 100 (FIG. 1). However, it should be understood that parallel LDPC encoder 106 and LDPC decoder 114 may use any other suitable LDPC code instead of or in addition to parity check matrix 301. Parity check matrix 301 is a quasi-cyclic (QC) parity check matrix. A QC parity check matrix is a parity check matrix which is made up of sub-matrices which are derived from permutations of the columns of an identify matrix. These sub-matrices are sometimes referred to as circulants. For example, in FIG. 3, each entry in parity check matrix 301 represents an S×S circulant, where S=81. According to the IEEE 802.11n standards, S may be 27, 54, or 81. Each circulant in parity check matrix 301 may be an S×S zero matrix (e.g., matrix of all zeros), an S×S identity matrix, or an S×S identity matrix shifted by some amount. Therefore, a parity check matrix may be represented in the form shown in FIG. 3, in which each entry representing a circulant is a number between −1 and 80 to indicate a zero matrix (in the case of a −1) or the amount that an identity matrix is shifted. Circulants 302 are illustrative circulants derived from an 8×8 identity matrix. Circulant 302a represents an 8×8 identity matrix, circulant 302b represents an 8×8 identity matrix that has been shifted by two positions, and circulant 302c represents an 8×8 identity matrix that has been shifted by five positions. This compressed representation of a quasi-cyclic parity check matrix shown in FIG. 3 allows a QC-LDPC coding system, such as that illustrated in FIG. 1, to store a QC parity check matrix using less memory than would be required to store all of the bit values of a non-QC LDPC parity check matrix.

With continued reference to FIG. 3, illustrative parity check matrix 301 is a matrix with 4×24 circulants, where each circulant is an 81×81 matrix. Thus, parity check matrix 301 is actually a 324×1994 parity check matrix. More generally, parity check matrix 301 is a (N-K)×N matrix where N=1944 and K=1620 with a circulant size S=81.

Figure 4:
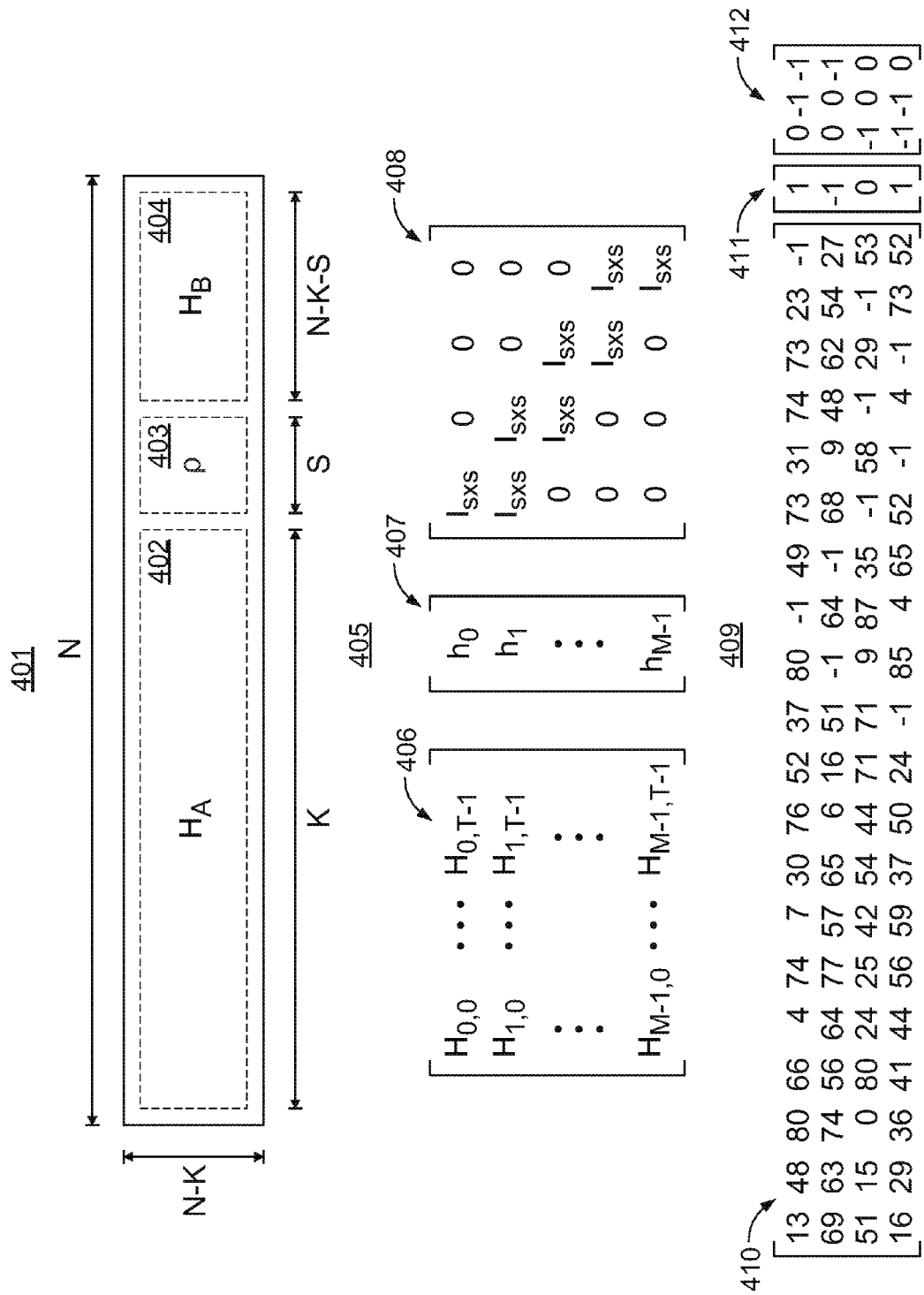
FIG. 4 shows the illustrative parity check matrix of FIG. 3 divided into three parity check sub-matrices.

The generation of parity check bits, p, may be illustrated with reference to FIG. 4. It can be seen that parity check matrix 409 is the same as parity check matrix 301 of FIG. 3. Parity check matrix 409 may be divided into three sub-matrices, $H_A$ 410, ρ 411, and $H_B$ 412. The dimensions of these sub-matrices are illustrated by generalized parity check matrix 401. Parity check matrix 401 is an N-K×N matrix. Sub-matrix $H_A$ 402 is an N-K×K matrix, sub-matrix ρ 403 is an N-K×S matrix, and sub-matrix $H_B$ 404 is an N-K×N-K-S matrix.

The properties of these sub-matrices are shown by generalized parity check matrix 405. Let M=(N-K)/S or equivalently the number of circulant rows in the parity check matrix (for example, in the illustrated parity check matrix 410 of FIG. 4, M=4). Let T=K/S (i.e., 20) or equivalently the number of circulant columns in sub-matrix $H_B$ 404. Sub-matrix $H_A$ 406 is made up of M×T circulants. Sub-matrix ρ 403 is a vector of M circulants, where the sum of the elements in sub-matrix ρ 403 is equal to the identity matrix. Sub-matrix $H_B$ 404 is a diagonal matrix made up of M×M−1 circulants having the illustrated form.

An LDPC codeword c satisfies the relationship:

$$y = Hc^T = 0 \quad (EQ. 1),$$

where H is a parity check matrix. Codeword, c, can be divided into a message vector b and a parity check vector p. Parity check vector p can be written as:

$$p = [q_0 q_1 \ldots q_{M-1}] \quad (EQ. 2),$$

where each parity check sub-vector $q_1$ is a 1×S vector. As shown in FIG. 4, parity check matrix H can be divided into sub-matrices $H_A$, ρ, and $H_B$. EQ. 1 can therefore be rewritten as:

$$y = [H_A \rho H_B][bp]^T = 0 = H_A b^T + \rho(q_0)^T + H_B[q_1 q_2 \ldots q_{S-1}] \quad (EQ. 3).$$

Let $HAb^T = [r_0 \, r_1 \ldots r_{M-1}]^T$, where each sub-vector $r_i$ is a 1×S vector. As described above, sub-matrix ρ is defined such that the sum of the elements of the matrix are equal to the identity matrix (i.e., $\Sigma_i h_i = I_{S \times S}$). Therefore, by multiplying EQ. 3 by a block-row matrix, each block-element of which is an identity matrix, it can be seen that:

$$\Sigma_i r_i = q_0 \quad (EQ. 4).$$

From this equation (EQ. 4), it can be seen that the first parity check sub-vector, $q_0$, can be calculated from the r vector. The remaining parity check sub-vectors $[q_1 \, q_2 \ldots q_{M-1}]$ can be calculated recursively as follows:

1) $r_0^T + h_0 q_0^T + q_1^T = 0 \rightarrow q_1^T = r_0^T + h_0 q_0^T r_1 + h_1 q_0^T + q_1^T + q_2^T = 0 \rightarrow q_2^T = r_1^T + h_1 q_0^T + q_1^T \ldots r_k^T + h_k q_0^T \alpha q_k^T + q_{k+1}^T = 0 \rightarrow q_{k+1}^T = r_k^T + h_k q_0^T + q_k^T$, when $k \neq 0$ and $k \neq M-1$.

2) $r_{M-1}^T + h_{M-1} q_0^T + q_{M-1}^T = 0 \rightarrow q_{M-1}^T = r_{M-1}^T + h_{M-1} q_0^T \quad (EQ. 5).$ As described above, the parity check matrix for the LDPC code is made up of S×S dimension circulant sub-matrixes $H_{ij} = P_n$ that may be derived from the identity matrix by rotating the rows or columns by i. If $b_j = [x_{jS+S-n}, \ldots x_{jS+S-1}, x_{jS}, x_{jS+1}, \ldots x_{jS+S-n+1}]$, the computation of $H_A b$ may be performed using:

$$H_A b = \begin{bmatrix} H_{0,0} & \cdots & H_{0,T-1} \\ H_{1,0} & \cdots & H_{1,T-1} \\ \vdots & & \vdots \\ H_{M-1,0} & \cdots & H_{M-1,T-1} \end{bmatrix} \begin{bmatrix} \bar{b}_0 \\ \bar{b}_1 \\ \vdots \\ \bar{b}_{T-1} \end{bmatrix} = [\underline{H}_0 \bar{b}_0 + \underline{H}_1 \bar{b}_1 + \ldots + \underline{H}_{T-1} \bar{b}_{T-1}], \quad (EQ. 6)$$

where $$\underline{H}_i = \begin{bmatrix} H_{0,i} \\ \vdots \\ H_{M-1,i} \end{bmatrix}.$$

Figure 5:
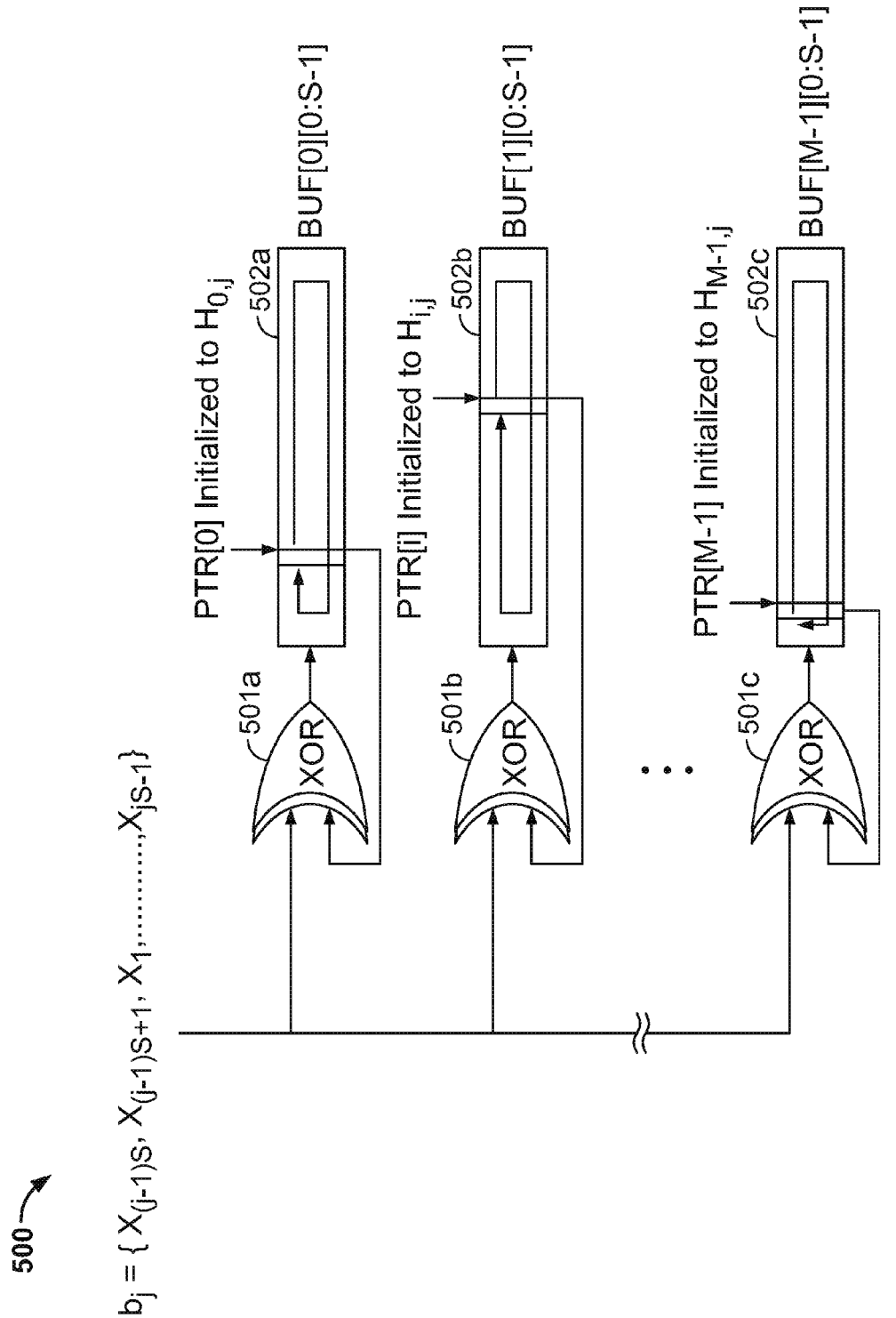
FIG. 5 is a simplified block diagram of a matrix-vector multiplication unit of a parallel LDPC encoder.

FIG. 5 is a simplified and illustrative block diagram 500 of a portion of a parallel LDPC encoder such as parallel LDPC encoder 106 of FIG. 1. Block diagram 500 is an illustrative matrix-vector multiplication unit for calculating the vector multiplication $H_A b^T$ based on EQ. 6. In particular, M circular buffers 501 may be used to calculate the elements of the N-K×1 column vector $H_j \bar{b}_j$. The M circular buffers 501 {BUF [0], BUF[1], BUF[M−1]} each can store S bits. If there are K message bits to be encoded, the K message bits may be divided into T blocks of size S. In one embodiment, the K message bits may be processed as follows:

1. Initialize the contents of circular buffers 501 to zero.
2. For every block j of S message bits:
   a) Initialize pointers PTR[i] for BUF[i] to $n = h_{ij}$.
   b) XOR incoming message bit, $b_j$, with the current contents of buffer at the location pointed to by PTR[i] and write back the result of the XOR operation to the same buffer location. This operation may be performed for each circular buffer 501.
   c) Increment PTR[i]. Buffers 501 are circular, so the pointers will wrap around to 0 after reaching the value S−1.

After all T blocks of S bits are processed in this manner (i.e., K bits), the contents of circular buffers 501 will contain the result of vector multiplication $H_A b^T = [r_0 \, r_1 \ldots r_{M-1}]^T$. This matrix-vector multiplication unit shown in FIG. 5 represents one suitable approach for calculating the vector multiplication $H_A b^T$. It should be understood that this multiplication may be performed using other suitable hardware implementations or using software running on any suitable hardware processor.

Figure 6:
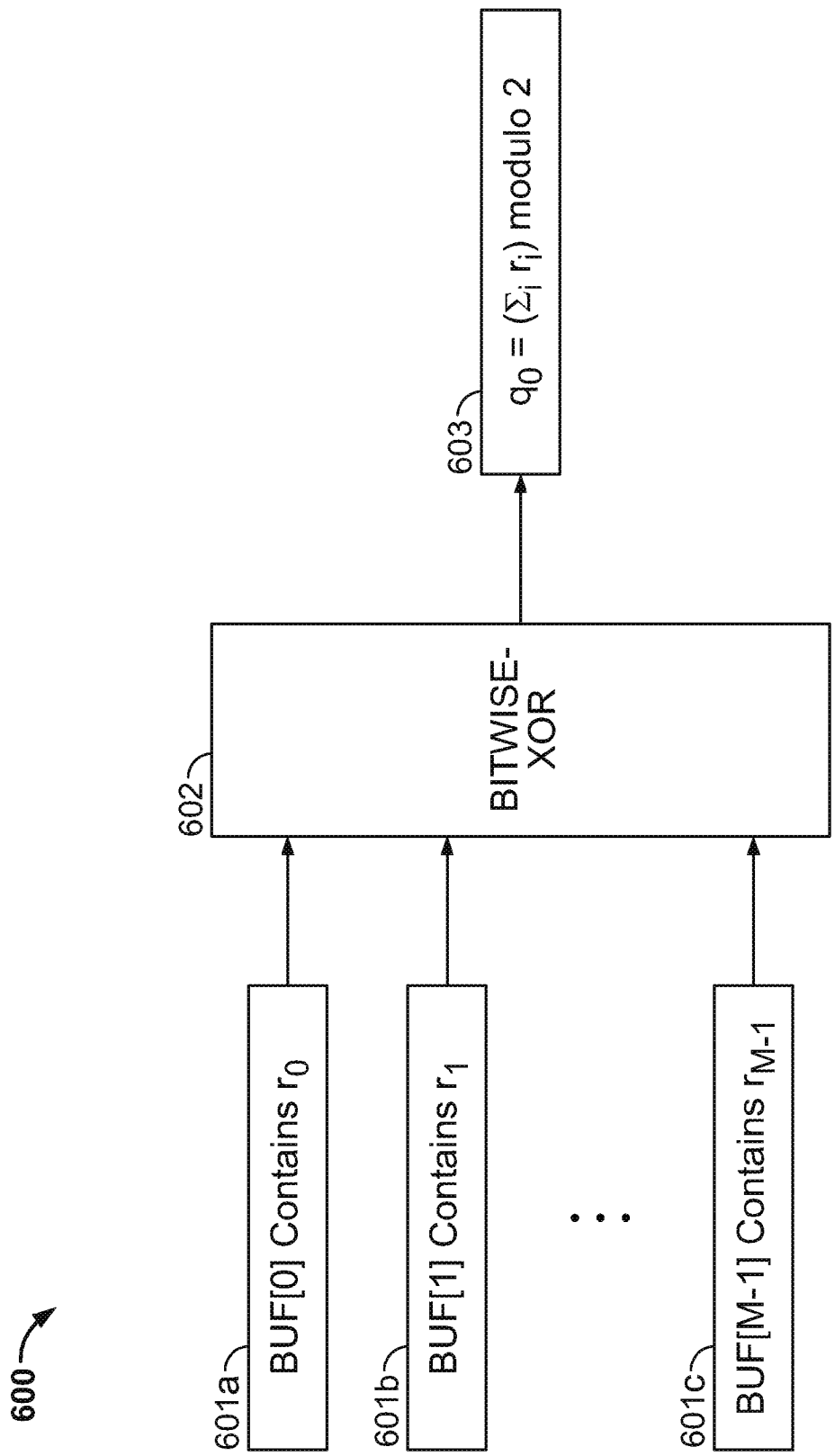
FIG. 6 is a simplified block diagram of a bitwise-XOR unit of a parallel LDPC encoder.

FIG. 6 is a simplified and illustrative block diagram 600 of another portion of a parallel LDPC encoder such as parallel LDPC encoder 106 of FIG. 1. Block diagram 600 represents one illustrative approach for calculating a first parity check sub-vector, $q_0$, from the r vector. The r vector may, for example, be calculated using the process described with respect to FIG. 5. As shown by EQ. 4:

$$q_0[k] = (\Sigma_i r_i[k]) \quad (EQ. 7),$$

where $k = \{0, 1, \ldots, S-1\}$ is the bit index. This calculation may be performed using a bitwise-XOR operation illustrated by BITWISE-XOR 602. BITWISE-XOR 602 receives sub-vectors $\{r_0 \, r_1 \ldots r_{M-1}\}$ from circular buffers 601. Circular buffers 601 may be same as circular buffers 501 after the vector multiplication $H_A b^T$ described in FIG. 5 is complete. The result of the bitwise-XOR operation, $q_0$, is stored in buffer 603. Simplified block diagram 600 represents one suitable approach for calculating the sum of sub-vectors $\{r_0 \, r_1 \ldots r_{M-1}\}$. It should be understood that this calculations may be performed using other suitable hardware implementations or using software running on any suitable hardware processor.

After the first parity check sub-vector, $q_0$, is calculated, the remaining parity check sub-vectors, $\{q_1 \, q_2 \ldots q_{M-1}\}$, may be recursively calculated based on EQ. 5 above. In particular, the parity check sub-vectors may be computed using a bitwise-XOR operation as follows:

$$q_1[i] = r_0[i] \text{XOR}(q_0 h_0^T)[i],$$

$$q_{M-1}[i] = r_{M-1}[i] \text{XOR}(q_0 h_{M-1}^T)[i],$$

$$q_k[i] = r_{k-1}[i] \text{XOR} q_{k-1}[i] \text{XOR}(q_0 h_{k-1}^T)[i],$$

for $k = \{1, 2, \ldots, M-2\}$ (EQ. 8).

Parity check matrices 301 (FIG. 3) and 409 (FIG. 4) have the following properties:

$h_0 = h_{M-1} = P_1$ (i.e., identity matrix shifted by 1), $h_{M/2} = I_{S \times S}$, and $h_k = 0$ for all remaining values of k. These properties apply to a category of LDPC codes that includes the LDPC codes proposed for the IEEE 802.11n standards belong. Noting that $q_0[i]P_1=q_0[(i+1)$ modulo $S]$, EQ. 8 can be simplified to:

$$q_1[i]=q_0[(i+1)\text{modulo }S]\text{XOR}r_0[i],$$

$$q_{M-1}[i]=q_0[(i+1)\text{modulo }S]\text{XOR}r_{M-1}[i],$$

$$q_{M/2}[i]=q_0[i]\text{XOR}q_{(M/2)-1}[i]\text{XOR}r_{(M/2)-1},$$

$$q_k[i]=q_{k-1}[i]\text{XOR}r_{k-1},$$

for all $k=\{0, 1, \ldots, M-1\}$, excluding $k=\{1, M/2, M-1\}$ (EQ. 9).

These equations (EQ. 9) can be rewritten as:

$$q_1[i]=q_0[(i+1)\text{modulo }S]\text{XOR}r_0[i],$$

$$q_{M-1}[i]=q_0[(i+1)\text{modulo }S]\text{XOR}r_{M-1}[i],$$

$$q_k[i]=q_{k-1}[i]\text{XOR}r_{k-1}, \text{ for } k=\{1, 2, \ldots M/2-1\}$$

$$q_{k-1}[i]=q_k[i]\text{XOR}r_{k-1}, \text{ for } k=\{M/2+1, \ldots, M-2\}$$

$$q_{M/2}[i]=q_0[i]\text{XOR}q_{(M/2)-1}[i]\text{XOR}r_{(M/2)-1},$$

$$q_k[i]=q_{k-1}[i]\text{XOR}r_{k-1} \quad \text{(EQ. 10)}.$$

Using these equations (EQ. 10), parity check sub-vectors $q_1$ and $q_{M-1}$ may be calculated based on first parity check sub-vector, $q_0$. In an embodiment, $q_1$ and $q_{M-1}$ may be calculated in parallel. After parity check sub-vectors $q_1$ and $q_{M-1}$ are calculated, the remaining parity check sub-vectors, may be recursively calculated in two parallel sets: $S_1=\{q_2, \ldots, q_{M/2-1}\}$ and $S_2=\{q_{M/2+1}, \ldots, q_{M-2}\}$. By calculating the parity check sub-vectors in parallel, the time required to calculate these vectors may be cut in half. The elements of $S_1$ may be computed in the following order: $q_2, q_3, \ldots, q_{M/2-1}, q_{M/2}$. The elements of $S_2$ may be computed in the following order: $q_{M-2}, q_{M-3}, \ldots, q_{M/2+1}$. These steps are illustrated graphically in FIG. 7.

Figure 7:
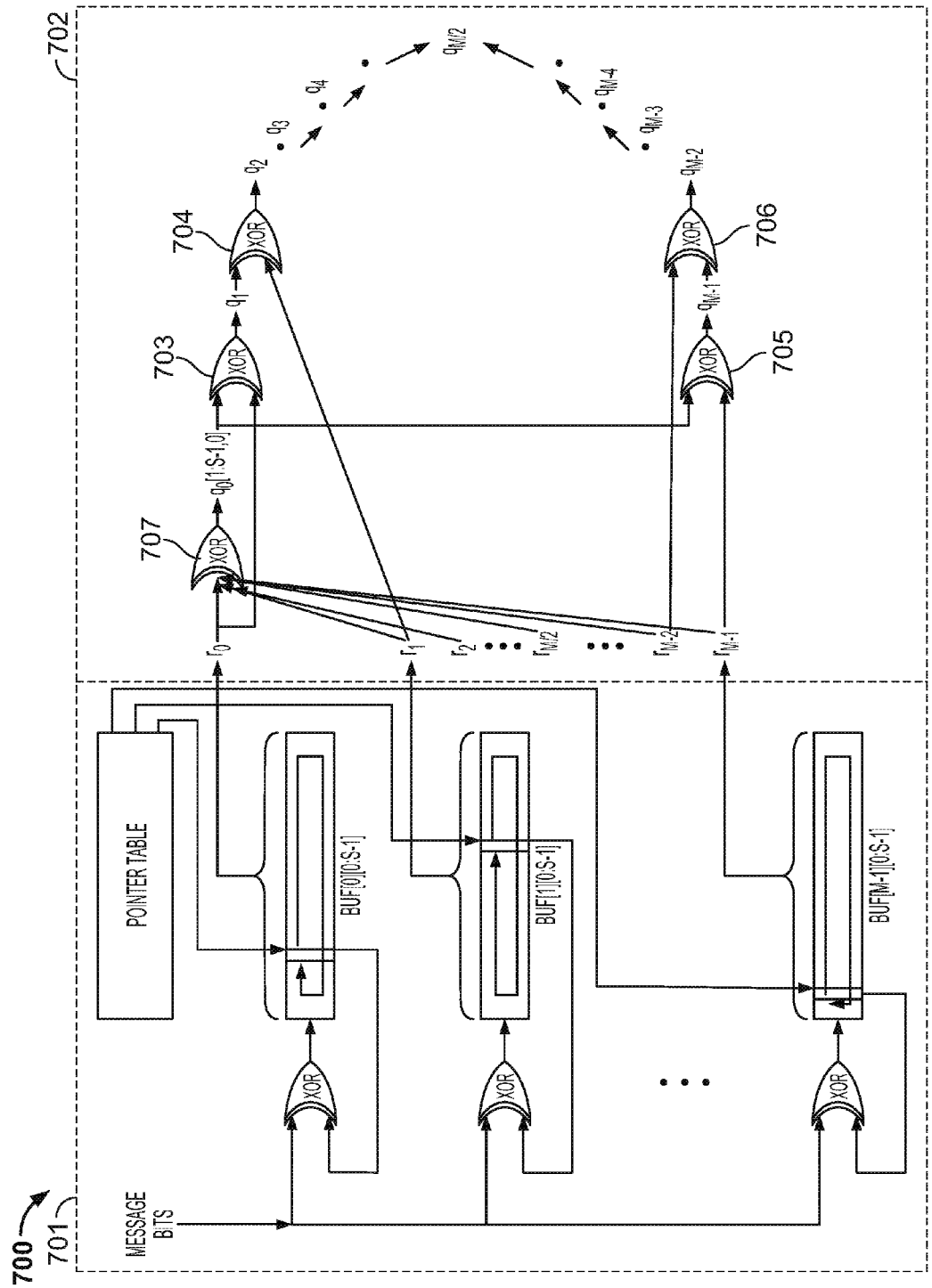
FIG. 7 is a simplified block diagram that illustrates the parallel recursion operations of a parallel LDPC encoder.

FIG. 7 is a simplified and illustrative block diagram 700 of a parallel LDPC encoder such as parallel LDPC encoder 106 of FIG. 1. Circular buffers 701 may be used to calculate the vector multiplication $H_A b^T$. Circular buffers 701 may perform this vector multiplication in the same manner as described above with respect to FIG. 5. The output of circular buffers 701 is vector r. After the vector multiplication $H_A b^T$ is complete, parity check vector $p=[q_0\ q_1\ \ldots\ q_{M-1}]^T$ can be calculated from a series of bitwise-XOR operations 702. First, parity check sub-vector $q_0$ may be calculated using bitwise-XOR operation 707. Then, parity check sub-vectors $q_1$ and $q_{M-1}$ may be calculated, in parallel, from parity check sub-vector $q_0$ using bitwise-XOR operations 703 and 705. As shown in FIG. 7, the remaining parity check sub-vectors $\{q_2 \ldots q_{M-2}\}$ may also be computed in parallel pairs ($q_2$ and $q_{M-2}$, $q_3$ and $q_{M-3}$, etc.) using bitwise-XOR operations until reaching the final parity check sub-vector $q_{M/2}$. In order to simplify the illustration of FIG. 7, only the first few bitwise-XOR operations (703, 704, 705, 706, and 707) and their respective inputs are illustrated. The remaining bitwise-XOR operations may be performed based on EQ. 10. Furthermore, while the illustrative diagram of FIG. 7 shows several bitwise-XOR operations, it should be understood that all of these bitwise-XOR operations may be calculated using a selectable number of XOR gates, e.g., only one or two bitwise XOR gates. For example, using only one bitwise-XOR gate, the output of the bitwise-XOR gate may be fed back to its input along with a corresponding sub-vector value $r_i$ to generate the corresponding parity check vector sub-vector value $\{q_0\ q_1\ \ldots\ q_{M-1}\}$. Using only two bitwise-XOR gates, a first bitwise-XOR gate may be used to generate $q_0$ and an output of the first bitwise-XOR gate may be iteratively fed into a second bitwise-XOR gate with a second input chosen from $\{r_0 \ldots r_{M-1}\}$ to generate the remaining values in p, i.e., $\{q_1 \ldots q_{M-1}\}$. Simplified block diagram 700 represents one suitable approach for calculating the parallel, recursive calculation of parity check vector $p=[q_0\ q_1\ \ldots\ q_{M-1}]^T$. It should be understood that this calculations may be performed using other suitable hardware implementations or using software running on any suitable hardware processor.

Figure 8:
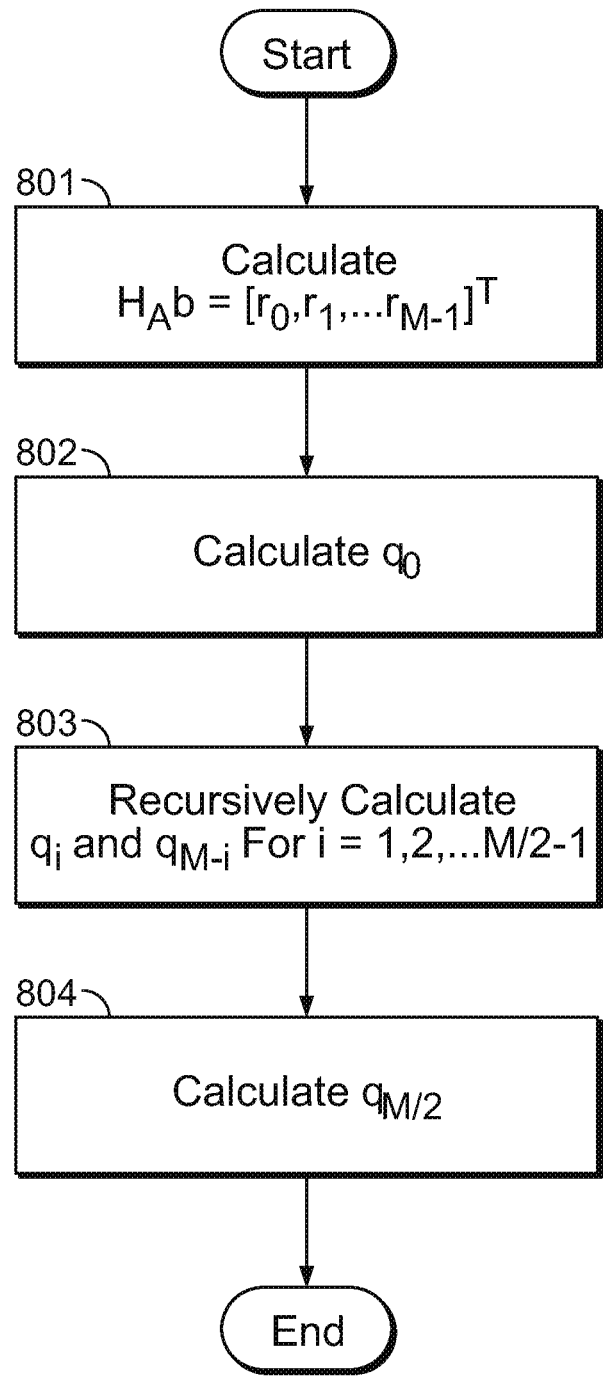
FIG. 8 is a flowchart of a process for recursively computing parity check symbols in parallel.

Referring now to FIG. 8, an illustrative process is shown for computing parity symbols in parallel. The process of FIG. 8 may be executed by any suitable LDPC encoder, such as parallel LDPC encoder 106 of FIG. 1. At 801, values are calculated for the vector r. Vector r may be calculated by multiplying incoming message bits, b, by parity check sub-matrix $H_A$ (i.e., $H_A b^T = r$). FIG. 4 shows illustrative parity check matrices H and the division of these matrices H into sub-matrices $H_A$, $\rho$, and $H_B$. Vector r can be expressed as a series of M sub-vectors $r_i$, each having S elements. One illustrative approach for calculating vector r is described above with respect to FIG. 5. At 802, the first parity check sub-vector $q_0$ is calculated from vector r. As shown in EQ. 4, parity check sub-vector $q_0$ is equal to the sum of sub-vectors $r_i$. One illustrative approach for calculating parity check sub-vector $q_0$ is described above with respect to FIG. 6. At 803, parity check sub-vectors $q_i$ are recursively calculated in parallel. For example, a first set of parity check sub-vectors $\{q_1, \ldots, q_{M/2-1}\}$ may be calculated recursively according to EQ. 10. A second set of parity check sub-vectors $\{q_{M-1}, \ldots, q_{M/2+1}\}$ may be calculated reclusively according to EQ. 10, in parallel with the first set of parity check sub-vectors. This, parallel, recursive series of calculations may be illustrated above with respect to FIG. 7. Finally, at 804, the final parity check sub-vector $q_{M/2}$ is calculated. The overall process of FIG. 8 may be implemented using the blocks schematically illustrated in FIG. 7. At the end of this process, a complete vector of parity check bits p is generated, where $p=[q_0, \ldots, q_{M-1}]^T$. As shown in FIG. 2, codeword c output by parallel LDPC encoder 106 (FIG. 1) includes message bits b and parity check bits p.

It is desirable to reduce the latency of LDPC encoders in order increase encoding speed. The parallel LDPC encoding process of FIG. 8 may be completed with a total latency as low as M/2+1. The calculation of vector r at 801 may not have latency overhead because this calculation may be performed as the message bit as received. The calculation of the first parity check sub-vector, $q_0$, (802) and the final parity check sub-vector, $q_{M-1}$, (803) may each span one clock cycle of latency. The parallel calculation of the remaining parity check sub-vectors $q_i$ may span (M/2−1) clock cycles of latency. The total latency of this parallel LDPC encoding process (i.e., M/2+1) may be approximately half of the latency of other LDPC encoding processes that do not calculate parity check values in parallel. Note that this latency is only for the encoding process. Other processes used to generate LDPC codewords such as shortening, puncturing, and repetition may add additional processing overheads.

The foregoing describes systems and methods for encoding a message using a parallel LDPC encoder. Those skilled in the art will appreciate that the invention can be practiced by other than the described embodiments, which are presented for the purpose of illustration rather than of limitation.

The above described embodiments of the present invention are presented for the purposes of illustration and not of limitation. Since many embodiments of the invention can be made without departing from the spirit and scope of the invention, the invention resides in the claims hereinafter appended. Furthermore, the present invention is not limited to a particular implementation. For example, one or more steps of methods described above may be performed in a different order or concurrently and still achieve desirable results. The invention may be implemented in hardware, such as on an application specific integrated circuit (ASIC) or on a field-programmable gate array (FPGA). The invention may also be implemented in software running on any suitable hardware processor.

What is claimed is:

1. A low-density parity check (LDPC) encoder for calculating parity check values for a message using an LDPC parity check matrix, the LDPC encoder comprising:
a matrix-vector multiplication unit operative to multiply a portion of the LDPC parity check matrix and the message to obtain an intermediate vector; and
a parallel encoder unit operative to
recursively calculate a first plurality of parity check values for the message based on the intermediate vector; and
recursively calculate a second plurality of parity check values for the message based on the intermediate vector,
wherein the first plurality of parity check values are calculated in parallel with the second plurality of parity check values.

2. The LDPC encoder of claim 1, wherein the matrix-vector multiplication unit comprises a plurality of circular buffers.

3. The LDPC encoder of claim 2, wherein the matrix-vector multiplication unit is operative to:
perform a plurality of XOR operations on the message and contents of the plurality of circular buffers, and
write results of the plurality of XOR operations back to the circular buffers.

4. The LDPC encoder of claim 1, wherein the parallel encoder unit is further operative to:
calculate an initial parity check value for the message based on the intermediate vector;
recursively calculating the first and the second plurality of parity check values for the message based on the initial parity check value; and
calculating a final parity check value for the message based on the first and the second plurality of parity check values for the message.

5. The LDPC encoder of claim 4, wherein the encoder further comprises a bitwise-XOR unit operative to calculate the initial parity check value for the message based on the intermediate vector.

6. The LDPC encoder of claim 1, wherein the parallel encoder unit comprises:
a first bitwise-XOR unit operative to recursively calculate the first plurality of parity check values for the message; and
a second bitwise-XOR unit operative to recursively calculate the second plurality of parity check values for the message.

7. A transmission system comprising:
the LDPC encoder of claim 1, wherein the LDPC encoder is operative to encode the message into a codeword; and
a modulator operative to modulate the codeword onto a channel.

8. The transmission system of claim 7, wherein the transmission system comprises an IEEE 802.11n wireless transmitter.

9. A method of calculating parity check values for a message using a low-density parity check (LDPC) code, the method comprising:
calculating, in an LDPC encoder, a product of a portion of an LDPC parity check matrix and the message to obtain an intermediate vector;
recursively calculating a first plurality of parity check values for the message based on the intermediate vector; and
recursively calculating a second plurality of parity check values for the message based on the intermediate vector, wherein the first plurality of parity check values are calculated in parallel with the second plurality of parity check values.

10. The method of claim 9, wherein calculating the product of the portion of the LDPC parity check matrix and the message to obtain the intermediate vector comprises performing a matrix-vector multiplication using a plurality of circular vectors.

11. The method of claim 10, wherein performing the matrix-vector multiplication comprises:
performing a plurality of XOR operations on the message and contents of the plurality of circular buffers; and
writing results of the plurality of XOR operations back to the circular buffers.

12. The method of claim 9, further comprising:
calculating an initial parity check value for the message based on the intermediate vector;
recursively calculating the first and the second plurality of parity check values for the message based on the initial parity check value; and
calculating a final parity check value for the message based on the first and the second plurality of parity check values for the message.

13. The method of claim 12, wherein calculating the initial parity check value for the message based on the intermediate vector comprises performing a bitwise-XOR operation.

14. The method of claim 9, wherein:
recursively calculating the first plurality of parity check values for the message comprises performing a first plurality of recursive bitwise-XOR operations; and
recursively calculating the second plurality of parity check values for the message comprises performing a second plurality of recursive bitwise-XOR operations.

15. An apparatus for calculating parity check values for a message using a low-density parity check (LDPC) code, the apparatus comprising:
means for calculating a product of a portion of an LDPC parity check matrix and the message to obtain an intermediate vector; and
means for recursively calculating a first plurality of parity check values for the message based on the intermediate vector; and
means for recursively calculating a second plurality of parity check values for the message based on the intermediate vector, wherein the first plurality of parity check values are calculated in parallel with the second plurality of parity check values.

16. The apparatus of claim 15, wherein the means for calculating the product of the portion of the LDPC parity check matrix and the message to obtain the intermediate vector comprises means for performing a matrix-vector multiplication using a plurality of circular vectors.

17. The apparatus of claim 16, wherein the means for performing the matrix-vector multiplication comprises:
means for performing a plurality of XOR operations on the message and contents of the plurality of circular buffers; and
means for writing results of the plurality of XOR operations back to the circular buffers.

18. The apparatus of claim 15 further comprising:
means for calculating an initial parity check value for the message based on the intermediate vector;
means for recursively calculating the first and the second plurality of parity check values for the message based on the initial parity check value; and
means for calculating a final parity check value for the message based on the first and the second plurality of parity check values for the message.

19. The method of claim 9, further comprising:
calculating a plurality of intermediate product sub-vectors from the product of the portion of the LDPC parity check matrix and the message;
combining the plurality of intermediate product sub-vectors to compute a first final parity check sub-vector for the message; and
computing a second final parity sub-vector for the message by combining the computed first final parity sub-vector for the message and one of the plurality of intermediate product sub-vectors.

20. The method of claim 9, further comprising:
recursively calculating respective ones of the first plurality of parity check values for the message based on respective first sub-vectors of the intermediate vector; and
recursively calculating respective ones of the second plurality of parity check values for the message based on respective second sub-vectors the intermediate vector.

* * * * *